United States Patent [19]

Carobolante

[11] Patent Number: 5,245,222
[45] Date of Patent: Sep. 14, 1993

[54] METHOD AND APPARATUS FOR BUFFERING ELECTRICAL SIGNALS

[75] Inventor: Francesco Carobolante, Phoenix, Ariz.

[73] Assignee: SGS-Thomson Microelectronics, Inc., Carrollton, Tex.

[21] Appl. No.: 843,580

[22] Filed: Feb. 28, 1992

[51] Int. Cl.[5] .......................................... H03K 17/60
[52] U.S. Cl. .................................. 307/254; 307/255; 307/490; 307/491; 307/500; 330/288
[58] Field of Search ............... 307/253, 254, 255, 475, 307/490, 491, 493, 500, 630, 631, 633, 315; 330/288, 310

[56] References Cited

U.S. PATENT DOCUMENTS

| | | | |
|---|---|---|---|
| 3,320,551 | 5/1967 | Miller | 307/310 |
| 3,714,600 | 1/1973 | Kuijk et al. | 330/288 |
| 3,902,079 | 8/1975 | Almed | 307/254 |
| 4,125,787 | 11/1978 | Onhinata et al. | 307/631 |
| 4,251,743 | 2/1981 | Hareyama | 307/254 |
| 4,283,641 | 8/1981 | Skingley | 307/493 |
| 4,398,205 | 8/1983 | Spellman et al. | 307/631 |
| 4,472,642 | 9/1984 | Akamatsu | 307/255 |
| 4,550,262 | 10/1985 | Kohsiek | 330/288 |
| 4,716,305 | 12/1987 | Sakuragi et al. | 307/254 |
| 4,734,598 | 3/1988 | Böhme | 307/491 |
| 5,124,586 | 6/1992 | Carobolante | 307/490 |

FOREIGN PATENT DOCUMENTS

| | | | |
|---|---|---|---|
| 0240637 | 11/1986 | Fed. Rep. of Germany | 307/255 |
| 0099831 | 7/1980 | Japan | 307/255 |

OTHER PUBLICATIONS

Sheng, "Composite Transitor", May, 6, 1975, Defensive Publication T934,009.

Primary Examiner—William L. Sikes
Assistant Examiner—Terry D. Cunningham
Attorney, Agent, or Firm—Richard A. Bachand; Lisa K. Jorgenson; Richard K. Robinson

[57] ABSTRACT

A circuit and method for buffering a high output impedance voltage generator circuit to a low input impedance load circuit is described. Two emitter-follower stages are used with a load current feedback configuration so that the base to emitter voltages of all four transistors maintain a fixed relationship and therefore the output voltage presented to the load maintains a fixed relationship to the input voltage presented to the buffer amplifier circuit.

22 Claims, 2 Drawing Sheets

FOR $V_{BE}$ (PNP's) < $V_{BE}$ (NPN's)

METHOD AND APPARATUS FOR BUFFERING ELECTRICAL SIGNALS

BACKGROUND OF THE INVENTION

1. FIELD OF THE INVENTION

This invention relates to improvements in circuitry for buffering electronic circuits to each other, and more particularly to improvements in circuitry for buffering a circuit that has an output voltage at a high output impedance to a low input impedance load or load circuit while maintaining an accurate output voltage, regardless of the load conditions.

2. DESCRIPTION OF THE PRIOR ART

It is a common technique to interpose a "buffer" amplifier, usually incorporating an emitter-follower circuit, between two circuits to minimize the interaction between the two circuits and to isolate the first circuit from the second. Typically the buffer will have a high input impedance to impose only light loading on the first circuit, and a low output impedance to enable the buffer to drive heavy loads, such as those presenting small load resistances. Without a buffer amplifier between a circuit having a high output impedance and a circuit with a low input impedance, most of the signal is dropped across the internal impedance of the source. Properly set up, the buffer amplifier will present an output voltage equal to its input voltage.

There are typically two ways to implement the buffer amplifier. The first way is using open loop circuits in which there is no voltage feedback. The second way is using closed loop circuits in which there is voltage feedback. One of the advantages of open loop circuits is that they offer greater response speed than closed loop circuits, generally having shorter propagation delay. The problem with open loop circuits is that they are imprecise, since there is no way of correcting output signal errors. On the other hand, one of the advantages of closed loop circuits is the greater accuracy and precision that feedback makes possible. The drawbacks of closed loop circuits are that gain is traded off for precision, and the response speed is slower, since the propagation delay is increased. Also, the stability of the loop in closed loop circuits becomes a problem, since out-of-control oscillations may occur; therefore, the bandwidth of the loop is usually reduced to insure stability. Thus, if there is a requirement for wide bandwidth, the use of a voltage feedback loop may be inappropriate and an open loop approach may be necessary.

When constructing buffer amplifier circuits that use several cascaded bipolar transistor stages, it is necessary to provide a "matching" of the base to emitter voltages ($V_{BE}$'s) of the transistors in the various stages to enable the output voltage to be a replica, as precisely as possible, of the input voltage. Such matching can be achieved by proper control of the relevant parameters, such as the collector currents, the type of transistors (i.e., NPN or PNP), the areas or sizes of the emitters, the geometry of the devices, and the collector-emitter voltages. In a bipolar transistor $V_{BE}$ follows the formula:

$$V_{BE} = V_T \ln \frac{I_C}{I_S}$$

where $V_T$ is approximately equal to 26 mV and $I_a$ is a technology-dependent parameter which is proportional to the emitter area of the transistor. Therefore, $V_{BE}$ decreases by approximately 18 mV for every doubling of the emitter area. Not only is the $V_{BE}$ directly affected by the area of the emitter of a transistor, but also by collector current. Therefore, $V_{BE}$'s can be closely matched in the stages by appropriately sizing the emitters and the relative collector currents.

Thus, the usual method of matching $V_{BE}$'s involves imposing equal currents through transistors that are of the same type (i.e., both NPNs or PNPs) and emitter size. For example, two NPN transistors of equal size handling the same collector current will have equal $V_{BE}$'s. However, an NPN transistor and a PNP transistor will generally have different $V_{BE}$'s for the same collector current. In the past, at times the $V_{BE}$'s of NPNs have been matched to PNPs, but only for establishing desired static conditions, such as biasing. $V_{BE}$ matching has not been used for transistors carrying dynamic signals. In light of the formula given above, however, it becomes apparent that an approximation of the voltage drop ($V_{BE}$) on an NPN transistor to that of a PNP transistor for the same current may be obtained by appropriately scaling their relative emitter areas (if the two devices are not intrinsically similar due to their construction).

It can be seen that the simplest multiple transistor buffer amplifier comprises two cascaded "emitter follower" stages that are of opposite polarity, i.e., one NPN and one PNP, to partially compensate for the $V_{BE}$ voltage drops.

Not only is the $V_{BE}$ of a transistor in one stage typically different from the $V_{BE}$ of a transistor in another stage, unless they are purposely made equal by imposing special conditions, but the transistors will also tend to have different collector currents according to the respective loads. Accordingly, what is needed is a circuit that matches the $V_{BE}$ of an NPN transistor in one stage to the $V_{BE}$ of a PNP transistor in another stage independent of the current in the load to achieve at least a first order load independence. For transistors which have $V_{BE}$'s within a certain range, the circuit should automatically establish the required collector currents in the two stages so that equal $V_{BE}$'s are continuously maintained. This current will be dependent on the transistor type and will not necessarily be equal in both stages.

SUMMARY OF THE INVENTION

In light of the above, therefore, it is an object of the invention to provide an improved apparatus and method for buffering a generator circuit having a high output impedance to a load having a low input impedance that maintains an output voltage substantially equal to the input voltage despite variations in the loading conditions and the input signal.

It is another object of the invention to provide an improved apparatus and method of the type described to provide an output signal over a wide bandwidth.

It is yet another object of the invention to provide an improved apparatus and method of the type described to provide a buffer circuit having the speed of response typical of open loop implementation.

It is still another object of the invention to provide an improved apparatus and method of the type described that is "self biasing" in that it uses load current for biasing and does not require externally provided biasing currents to operate.

It is yet another object of the invention to provide an improved apparatus and method of the type described that utilizes "matching" of the $V_{BE}$'s of transistors in different stages of an emitter-follower circuit to provide an output voltage that is precisely equal to the input voltage regardless of the load conditions.

It is still another object of the invention to provide an improved apparatus and method of the type described that automatically sets the required collector currents in the two stages of the emitter-follower circuits so that equal $V_{BE}$'s in the two stages are continuously maintained, using load current feedback techniques.

These and other objects, features and advantages of the invention will be apparent to those skilled in the art from the following detailed description of the invention, when read in conjunction with the accompanying drawings and appended claims.

In accordance with a broad aspect of the invention a buffer circuit is provided for buffering the voltage output of an input circuit presenting a high output impedance to a load presenting a low impedance. A load current flows through a first emitter-follower stage to an output node connected to the load. The first emitter-follower stage has first and second transistors, each having an emitter, a base, and a collector, the first transistor being diode-connected to a supply voltage, and a second emitter-follower stage has third and fourth transistors, each having an emitter, a base, and a collector, the base-emitter voltage of the third transistor being equal to the base-emitter voltage of the first transistor to force a current to flow in the second stage. An input voltage signal from the input circuit is delivered to the base of the fourth transistor. Means are provided for feeding back a current proportional to the load current to the second stage to automatically maintain a fixed relationship between the voltage of the $V_{BE}$ of the second transistor and the $V_{BE}$ of the fourth transistor, thereby maintaining a voltage at the output node that has a fixed relationship to the input voltage signal. A startup transistor is also provided for starting the circuit when no load current is being drawn by driving a current into the load circuit.

In accordance with another broad aspect of the invention, a method for buffering an input voltage signal to a load is presented. The method includes providing a first emitter-follower stage through which a load current flows to an output node connected to the load, the first stage comprising first and second transistors, each having an emitter, a base, and a collector, the first transistor being diode-connected to a supply voltage, and providing a second emitter-follower stage comprising third and fourth transistors, each having an emitter, a base, and a collector. The base-emitter voltage of the first transistor is impressed on the base-emitter junction of the third transistor to force a current to flow in the second stage, and a portion of the load current is fed back to the second stage to maintain a fixed relationship between the voltage of the second transistor and the fourth transistor.

BRIEF DESCRIPTION OF THE DRAWINGS

The invention is illustrated in the accompanying drawings, in which.

In the circuits illustrated in the various figures, like reference numerals are used to denote like or similar parts.

DETAILED DESCRIPTION OF THE PREFERRED EMBODIMENT

Figure 1:
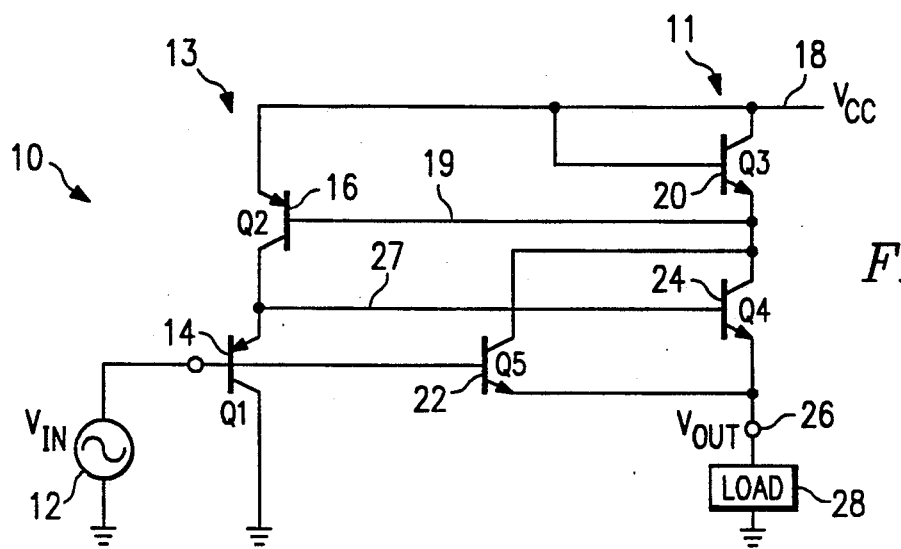
FIG. 1 is an electrical schematic diagram of a buffer amplifier circuit constructed in accordance with a preferred embodiment of the invention.

An electrical schematic diagram of a buffer amplifier 10 in which the apparatus and method in accordance with a preferred embodiment of the invention are embodied is shown in FIG. 1. The circuit 10 includes a first emitter-follower stage 11 that has two NPN transistors 20 and 24 with their emitter-collector paths connected between a $V_{cc}$ rail 18 and an output node 26. The base and collector of the first transistor 20 are connected to the $V_{cc}$ rail 18 so that the first transistor 20 is diode-connected thereto. A load 28 is shown connected between the output node 26 and a reference potential, or ground, as shown. The load 28 may be fabricated as a part of the circuit 10, or, the node 26 may be adapted for connection to a separate load circuit (not shown).

In addition, the circuit 10 includes a second emitter-follower stage 13 having two PNP transistors 16 and 14, with their emitter collector paths also connected between the $V_{cc}$ rail 18 and ground. The base of the PNP transistor 16 is connected by a line 19 to the emitter of the NPN transistor 20, and, the emitter of the PNP transistor 14 is connected to the base of the NPN transistor 24 by a line 27. As will be described, the line 19 provides a path on which a current proportional to the load current that flows in the first emitter-follower stage 11 to the PNP transistor 16, thereby providing the base-emitter voltage of the transistor 20 on the base emitter junction of the PNP transistor 16, forcing a current to flow through the second emitter-follower stage 13. Thus, the voltage at the output node 26 is maintained with a fixed relationship to the input voltage signal 12.

The circuit shown in FIG. 1 generates an accurate output voltage for a wide range of input voltages. Although the buffer amplifier 10 can be constructed of discrete components, preferably it is integrated onto a single semiconductor chip adapted for connection between a voltage generator circuit and a load circuit.

The operation of the circuit is based on a matching of the base to emitter voltages of transistors in two "emitter-follower" stages through the use of "load current feedback". If the errors due to base currents and Early effect voltages are neglected (which may be compensated for by more complex circuitry well known in the art), in order to have the output voltage ($V_{OUT}$) on the node 26 precisely match the input voltage ($V_{IN}$) 12, the $V_{BE}$ of PNP transistor 14 must match as precisely as possible the $V_{BE}$ of the NPN transistor 24, because the signal path of the input voltage is through the base-emitter junction of the transistor 14 and the base-emitter junction of the transistor 24 to the load 28.

In addition, the input voltage 12 to the buffer amplifier 10 is connected to the base of an NPN transistor 22 which assists in the startup of the circuit. This assistance may be necessary when the initial load current is zero, because in that condition there may be no current through the circuit with the result that the transistors are unbiased, since the buffer circuit 10 is "self biasing" using the load currents for proper biasing, and does not require externally provided biasing currents to operate. To solve the potential startup problem the transistor 22 drives a current into the load 28. Once the circuit 10 is operating, the load current flows through the collector-emitter junctions of the transistor 24 and the transistor 20.

The transistor 20, being diode-connected and with its emitter connected to the base of the transistor 16, imposes its $V_{BE}$ onto the base-emitter junction of the transistor 16, creating a collector current through the transistors 16 and 14. Since the concept of load current feedback is utilized in which the load current through the transistor 24 is partially fed back via the feedback line 19 to the base of the transistor 16 so as to continuously maintain the $V_{BE}$ of the transistor 14 equal to $V_{BE}$ of the transistor 24, the $V_{BE}$'s of all four transistors 14, 16, 20, and 24 are therefore equal, assuming the inherent $V_{BE}$ values of the transistors are not excessively different. If the $V_{BE}$ values of the particular transistors that are used in a given embodiment are very different, then other solutions may need to be implemented to reduce the output voltage error.

One solution that may be implemented is to properly size the emitter areas of the respective transistors. By appropriately sizing PNP emitter areas relative to NPNs, appropriate currents may be forced in the two stages for the same $V_{BE}$'s, thus minimizing errors.

Figure 4:
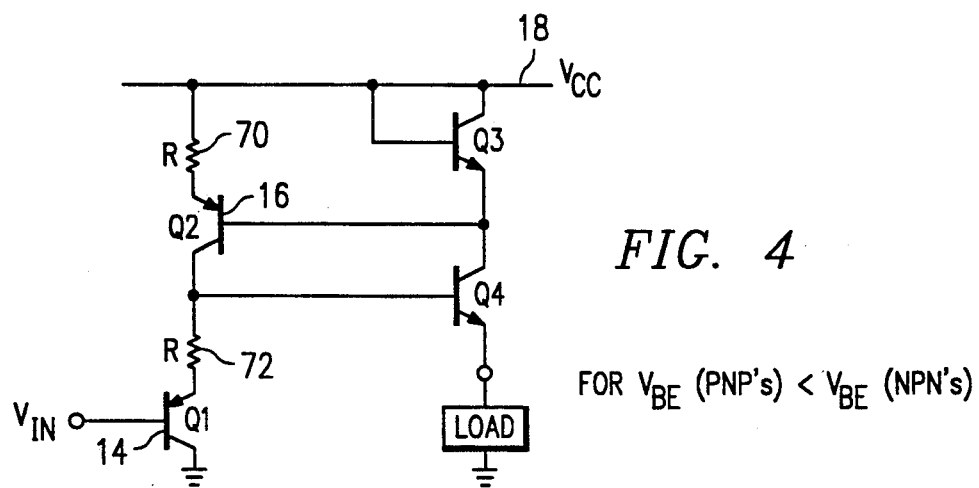
FIG. 4 is an electrical schematic diagram of a buffer amplifier circuit constructed in accordance with still another preferred embodiment of the invention in which resistors of substantially equal value are employed in series with the emitters of two of the transistors.
Figure 5:
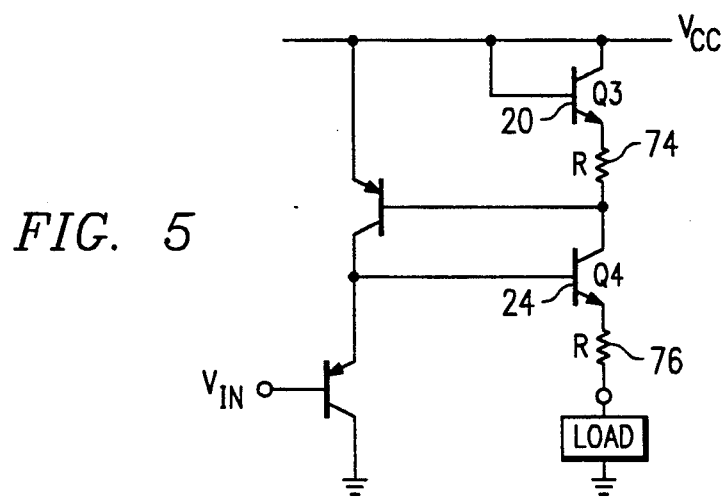
FIG. 5 is an electrical schematic diagram of a buffer amplifier circuit constructed in accordance with another preferred embodiment of the invention in which resistors are placed in series with the emitters of the transistors in the load current path.

Another solution that may be used is to employ resistors of substantially equal value in series with the emitters of the transistors of either stage to perform the correction. If the $V_{BE}$'s of the PNP transistors 14 and 16 are too small, the resistors would be placed in series with their emitters. This configuration is shown in FIG. 4, wherein a resistor 70 is connected between the voltage supply 18 and the emitter of transistor 16, and a resistor 72 of substantially equal value to resistor 70 is connected between the collector of the transistor 16 and the emitter of the transistor 14. On the other hand, if the $V_{BE}$'s of the NPN transistors 24 and 20 are too small, the resistors would be placed in series with their emitters. This configuration is shown in FIG. 5, wherein a resistor 74 is connected between the emitter of the transistor 20 and the collector of the transistor 24, and a resistor 76 of substantially equal value to resistor 74 is connected between the collector of the transistor 24 and the load device. However, this method of matching $V_{BE}$'s only works for a limited range of current, since the voltage drop on a $V_{BE}$ follows a logarithmic curve when plotted against current, while the resistor has a linear curve.

Figure 6:
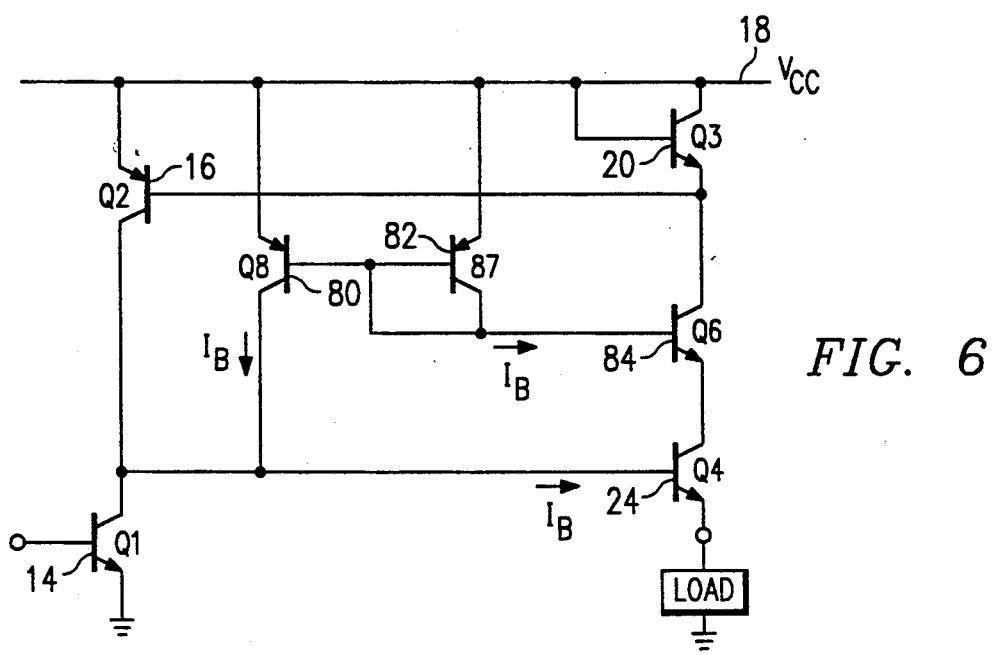
FIG. 6 is an electrical schematic diagram of a buffer amplifier circuit constructed in accordance with still another preferred embodiment of the invention in which a base current cancellation technique is employed.

Depending upon the application, the base current of the NPN transistor 24 may become a source of error if it is large enough compared to the collector current of the transistor 16. To eliminate this error a "base current cancellation" technique can be used by which the base current of the transistor 84 mirrored into the base of the transistor 24 to obtain a first order compensation. This configuration is illustrated in FIG. 6 wherein transistors 84, 82, and 80 have been added to "cancel out" the base current of the transistor 24. The emitter of PNP transistor 80 is connected to $V_{cc}$ 18, the collector of the transistor 80 is connected to the collector of the transistor 14 and the base of the transistor 24, and the base of the transistor 80 is connected to the base and collector of PNP transistor 82 and the base of the transistor 84. The emitter of the transistor 82 is connected to $V_{cc}$ 18, and the collector of the transistor 82 is connected to the base of the transistor 84. The collector of NPN transistor 84 is connected to the emitter of the transistor 20 and the emitter of the transistor 84 is connected to the collector of the transistor 24. In operation, if the transistor 84 is identical to the transistor 24, since they have approximately the same collector current, they also have approximately the same base current ($I_B$) which is "mirrored" by transistors 82 and 80 and fed back to the base of the transistor 24, thus "canceling" the error on the $V_{BE}$ of the transistor 14 due to $I_B$. More elaborate schemes may be adopted to cancel second order affects as known in the art.

Figure 2:
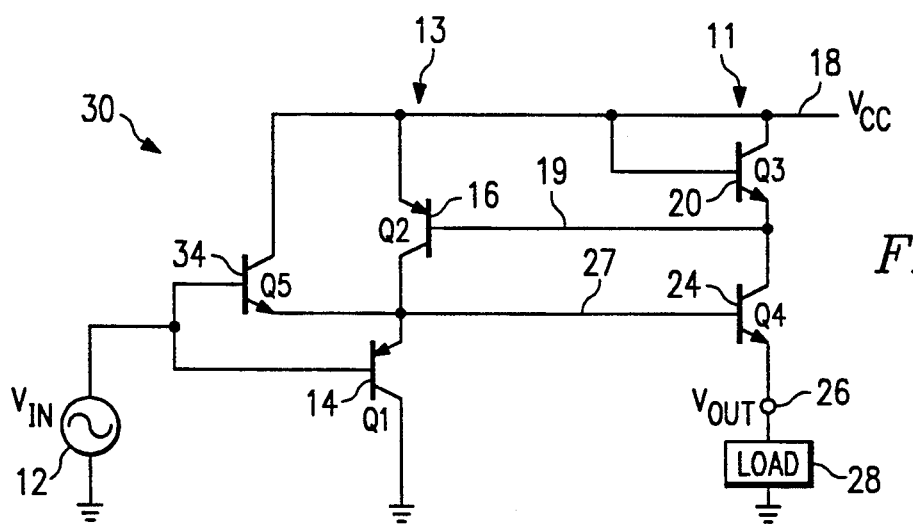
FIG. 2 is an electrical schematic diagram of a buffer amplifier circuit constructed in accordance with another preferred embodiment of the invention.

Another circuit embodiment 30, in accordance with the invention, is shown in FIG. 2. The circuit 30 is similar to the circuit described with respect to FIG. 1, except the startup transistor 34 is connected with its collector attached to the supply voltage 40, its base attached (as in FIG. 1) to the input voltage 32, and its emitter connected to drive a current into the base of the transistor 24 to create a current through the load 48. The operation of the FIG. 2 circuit configuration is different from the FIG. 1 embodiment because it supplies a load current only when $V_{IN}$ 32 is at least equal in magnitude to the $V_{BE}$ drops across the transistors, since both transistors 34 and 24 must be turned on.

As with the FIG. 1 embodiment, the emitter sizes may be varied to create equal $V_{BE}$'s among the various transistors. The same effect may also be achieved through the use of appropriate sized resistors in series with the emitters of the various stages. Base current cancellation techniques may also be employed to eliminate errors caused by excessive base currents of the transistor 24. As with the embodiment of FIG. 1 this circuit is self biasing.

Figure 3:
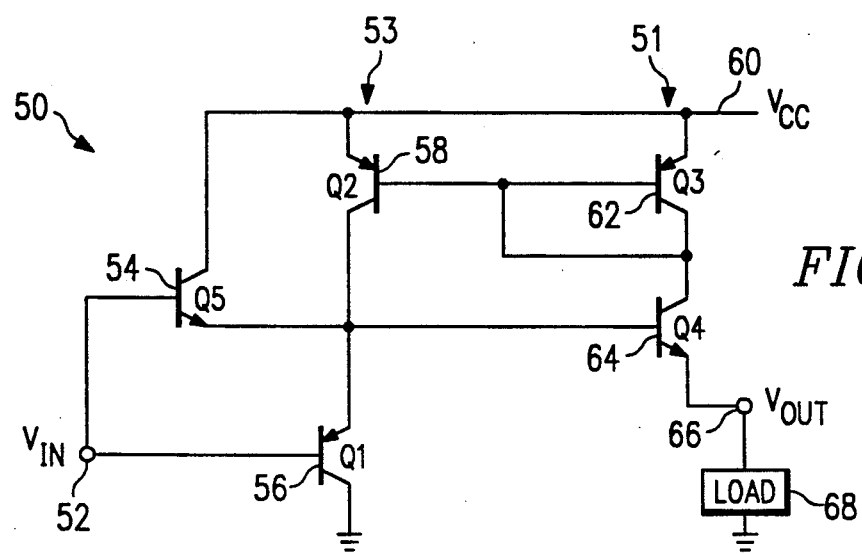
FIG. 3 is an electrical schematic diagram of a buffer amplifier circuit constructed in accordance with yet another preferred embodiment of the invention.

Another circuit embodiment 50 of the invention is shown in FIG. 3. This circuit embodiment includes a load current path 51 from the $V_{cc}$ rail 60 through the emitter-collectors a PNP transistor 62 and an NPN transistor 64 to an output node 66 to which a load 68 may be connected. A control current path 53 is provided through the emitter-collector paths of PNP transistors 58 and 56 between the $V_{cc}$ rail 60 and ground. The bases of the transistors 58 and 62 are connected to each other and to the collector of the transistor 62. Similarly, the base of the transistor 64 is connected to the collector of the transistor 58. The startup transistor 54 is an NPN device, having its emitter collector path connected between the $V_{cc}$ rail 60 and the emitter of the transistor 56. The input voltage signal is applied from an input node 52 to the bases of the transistors 54 and 56.

In contrast to the circuit embodiment described above with respect to FIGS. 1 and 2, in the circuit embodiment 50 of FIG. 3, the transistor 62 is a PNP transistor. The transistor 56 is forced to pass the same collector current as the transistor 64; however, this circuit need not have accurately matched $V_{BE}$'s for all its transistors, so an approximately constant offset between the $V_{IN}$ 52 and $V_{OUT}$ 66 may exist. Like the previously described embodiments this embodiment is "self biasing", and as with the previous embodiments, the emitter sizes may be varied to create equal $V_{BE}$'s among the various transistors. The same effect may also be achieved through the use of resistors of appropriate sizes placed in series with the emitters of the various stages. Base current cancellation techniques may also be employed to eliminate errors caused by excessive base currents of the transistor 24.

The above described implementations may also be realized in a complementary form, in which the first stage delivering current to the output is a PNP stage, while the second stage is an NPN stage. The start up transistor would be of PNP type. Equivalent circuits may be built using n-channel or p-channel transistors, thus avoiding problems with base current errors, although they would be more sensitive to drain-source voltages for good matching.

Although the invention has been described and illustrated with a certain degree of particularity, it is understood that the present disclosure has been made only by way of example, and that numerous changes in the combination and arrangements of parts can be resorted to by those skilled in the art without departing from the spirit and scope of the invention, as hereinafter claimed.

I claim:

1. A buffer circuit for connection between an input voltage signal and a load, comprising:
   a first emitter-follower stage through which a load current flows for delivery to the load, said emitter-follower stage comprising a first and a second transistor, each having an emitter, a base, and a collector, said first transistor having its emitter connected to the collector of the second transistor, and being diode-connected with its collector and base interconnected to a supply voltage, and the emitter of said second transistor being connected to a node for connection to the load;
   a second emitter-follower stage through which a control current flows between the supply voltage and a reference potential, said second emitter-follower stage comprising a third and a fourth transistor, each having an emitter, a base, and a collector, the emitter of the third transistor being connected to the supply voltage, the base of the third transistor being connected to the collector of the second transistor, the emitter of said fourth transistor being connected to the base of said second transistor and to the collector of the third transistor, the base of said fourth transistor being connected to receive said input voltage signal, and the collector of said fourth transistor being connected to the reference voltage;
   wherein a base-emitter voltage of the first transistor is applied across the base-emitter junction of the third transistor to provide said reference current through said second stage to maintain a voltage across the load that has a fixed relationship to the input voltage signal;
   and a startup transistor connected in parallel with said third transistor for starting the circuit when no load current is being drawn by driving a current into the load circuit.

2. The buffer circuit of claim 1 wherein said startup transistor has an emitter, base, and collector, the emitter of said startup transistor being connected to the collector of said third transistor, the collector of said startup transistor being connected to the emitter of said third transistor, and the base of said startup transistor being connected to receive said input voltage signal.

3. The buffer circuit of claim 1 wherein said startup transistor has an emitter, base, and collector, the emitter and base being connected respectively to the emitter and base of said fourth transistor, and the collector being connected to said supply voltage.

4. The buffer circuit of claim 1 wherein said buffer circuit has a high input impedance and low output impedance.

5. The circuit of claim 1 wherein base-emitter voltages of the second and fourth transistors are maintained with fixed values, thereby maintaining a voltage across said load that is substantially equal to the input voltage signal.

6. The circuit of claim 5 wherein the fixed values of the base-emitter voltages of the second and fourth transistors are substantially equal values.

7. The circuit of claim 5 wherein the emitter areas of the first and second transistors are substantially equal, and the emitter areas of the third and fourth transistors are substantially equal.

8. The circuit of claim 1 wherein the emitters of the transistors in the two stages are sized to produce a $V_{BE}$ in the second transistor that is substantially equal to the $V_{BE}$ of the fourth transistor.

9. The circuit of claim 1 wherein first and second resistors of substantially equal value are connected, respectively between the emitter of said first transistor and the collector of the second transistor, and from the emitter of said second transistor to the load connection node to maintain the $V_{BE}$ of said second transistor substantially equal to the $V_{BE}$ of said fourth transistor.

10. The circuit of claim 1 wherein first and second resistors of substantially equal value are connected, respectively between the supply voltage and the emitter of said third transistor, and from the collector of said third transistor to the emitter of said fourth transistor to maintain the $V_{BE}$ of the second transistor substantially equal to the $V_{BE}$ of the fourth transistor.

11. The circuit of claim 1 wherein said first and second transistors are NPN transistors and said third and fourth transistors are PNP transistors.

12. The circuit of claim 1 further comprisng a pass transistor having an emitter, a base, and a collector, said pass transistor being in series with the second transistor, said pass transistor having its base current mirrored into the base of said second transistor to obtain a first order compensation of the base current of said second transistor.

13. A circuit for buffering a high output impedance voltage generator circuit that provides an input voltage signal to a low input impedance load circuit, comprising:
   a first NPN transistor having an emitter, a base, and a collector, the base and collector being connected to a supply voltage;
   a second NPN transistor having an emitter, a base, and a collector, the collector being connected to the emitter of the first NPN transistor and the emitter being connected to the load circuit;

a first PNP transistor having an emitter, a base, and a collector, the emitter being connected to the supply voltage, the base being connected to the emitter of the first NPN transistor, and the collector being connected to the base of the second NPN transistor;

a second PNP transistor, having an emitter, a base, and a collector, the emitter being connected to the collector of the first PNP transistor, the collector being connected to a reference potential, and the base being connected to the input voltage signal.

14. The circuit of claim 13 further comprising a startup transistor having an emitter, a base, and a collector, the base being connected to the input voltage signal, the collector being connected to the emitter of the first NPN transistor, and the emitter being connected to the load circuit.

15. The circuit of claim 14 wherein said startup transistor is a NPN transistor.

16. The circuit of claim 13 further comprising a startup transistor having an emitter, a base, and a collector, the base being connected to the input voltage signal, the collector being connected to the emitter of the first PNP transistor, and the emitter being connected to the collector of the first PNP transistor.

17. The circuit of claim 16 wherein said startup transistor is a NPN transistor.

18. A buffer circuit for connection between an input voltage signal and a load, comprising:

a first emitter-follower stage for conducting a load current, said emitter-follower stage comprising a first and a second transistor, each having an emitter, a base, and a collector, said first transistor having its emitter connected to the collector of the second transistor, and being diode-connected with its collector and base interconnected to a supply voltage, and the emitter of said second transistor being connected to a node for connection to the load;

a second emitter-follower stage through which a control current flows between the supply voltage and a reference potential, said second emitter-follower stage comprising a third and a fourth transistor, each having an emitter, a base, and a collector, the emitter of the third transistor being connected to the supply voltage, the base of the third transistor being connected to the collector of the second transistor, the emitter of said fourth transistor being connected to the base of said second transistor and to the collector of the third transistor, the base of said fourth transistor being connected to receive said input voltage signal, and the collector of said fourth transistor being connected to the reference voltage, the emitter areas of the first and second transistors being sized to match the base to emitter voltages of said first and second transistors, and the emitter areas of the third and fourth transistors being sized to match the base to emitter voltages of said third and fourth transistors, wherein a base-emitter voltage of the first transistor is applied across the base-emitter junction of the third transistor to provide said reference current through said second stage to maintain a voltage across the load that is substantially equal to the input voltage signal;

and a startup transistor connected to one of said transistors of said second emitter-follower stage for starting the circuit when no load current is being drawn by driving a current into the load circuit, said startup transistor having an emitter, base, and collector, the emitter of said startup transistor being connected to the collector of said third transistor, the collector of said startup transistor being connected to the emitter of said third transistor, and the base of said startup transistor being connected to receive said input voltage signal.

19. A buffer circuit for connection between an input voltage signal and a load, comprising:

a first emitter-follower stage for conducting a load current, said emitter-follower stage comprising a first and a second transistor, each having an emitter, a base, and a collector, said first transistor having its emitter connected to the collector of the second transistor, and being diode-connected with its collector and base interconnected to a supply voltage, and the emitter of said second transistor being connected to a node for connection to the load;

a second emitter-follower stage through which a control current flows between the supply voltage and a reference potential, said second emitter-follower stage comprising a third and a fourth transistor, each having an emitter, a base, and a collector, the emitter of the third transistor being connected to the supply voltage, the base of the third transistor being connected to the collector of the second transistor, the emitter of said fourth transistor being connected to the base of said second transistor and to the collector of the third transistor, the base of said fourth transistor being connected to receive said input voltage signal, and the collector of said fourth transistor being connected to the reference voltage;

wherein a base-emitter voltage of the first transistor is applied across the base-emitter junction of the third transistor to provide said reference current through said second stage to maintain a voltage across the load that has a fixed relationship to the input voltage signal;

and first and second resistors of substantially equal value, said first and second resistors being connected, respectively, between the emitter of said fourth transistor and the collector of the third transistor, and from the emitter of said third transistor to the supply voltage to maintain the $V_{BE}$ of said second transistor substantially equal to the $V_{BE}$ of said fourth transistor.

20. A buffer circuit for connection between an input voltage signal and a load, comprising:

a first emitter-follower stage for conducting a load current, said emitter-follower stage comprising a first and a second transistor, each having an emitter, a base, and a collector, said first transistor having its emitter connected to the collector of the second transistor, and being diode-connected with its collector and base interconnected to a supply voltage, and the emitter of said second transistor being connected to a node for connection to the load;

a second emitter-follower stage through which a control current flows between the supply voltage and a reference potential, said second emitter-follower stage comprising a third and a fourth transistor, each having an emitter, a base, and a collector, the emitter of the third transistor being connected to the supply voltage, the base of the third transistor being connected to the collector of the second transistor, the emitter of said fourth transistor being connected to the base of said second transistor and to the collector of the third transistor, the base of said fourth transistor being connected to receive said input voltage signal, and the collector of said fourth transistor being connected to the reference voltage;

wherein a base-emitter voltage of the first transistor is applied across the base-emitter junction of the third transistor to provide said reference current through said second stage to maintain a voltage across the load that has a fixed relationship to the input voltage signal;

and a pass transistor having an emitter, a base, and a collector, said pass transistor being in series with the second transistor, said pass transistor having its base current mirrored into the base of said second transistor to obtain a first order compensation of the base current of said second transistor.

21. A buffer circuit for connection between an input voltage signal and a load, comprising:

a first emitter-follower stage for conducting a load current, said emitter-follower stage comprising a first and a second transistor, each having an emitter, a base, and a collector, said first transistor having its emitter connected to the collector of the second transistor, and being diode-connected with its collector and base interconnected to a supply voltage, and the emitter of said second transistor being connected to a node for connection to the load;

a second emitter-follower stage through which a control current flows between the supply voltage and a reference potential, said second emitter-follower stage comprising a third and a fourth transistor, each having an emitter, a base, and a collector, the emitter of the third transistor being connected to the supply voltage, the base of the third transistor being connected to the collector of the second transistor, the emitter of said fourth transistor being connected to the base of said second transistor and to the collector of the third transistor, the base of said fourth transistor being connected to receive said input voltage signal, and the collector of said fourth transistor being connected to the reference voltage, the emitter areas of the first and second transistors being substantially equal, and the emitter areas of the third and fourth transistors being substantially equal;

wherein a base-emitter voltage of the first transistor is applied across the base-emitter junction of the third transistor to provide said reference current through said second stage to maintain a voltage across the load that is substantially equal to the input voltage signal;

and a startup transistor connected to one of said transistors of said second emitter-follower stage for starting the circuit when no load current is being drawn by driving a current into the load circuit, said startup transistor having an emitter, base, and collector, the emitter and base being connected respectively to the emitter and base of said fourth transistor, and the collector being connected to said supply voltage.

22. A buffer circuit for connection between an input voltage signal and a load, comprising:

a first emitter-follower stage for conducting a load current, said emitter-follower stage comprising a first and a second transistor, each having an emitter, a base, and a collector, said first transistor having its emitter connected to the collector of the second transistor, and being diode-connected with its collector and base interconnected to a supply voltage, and the emitter of said second transistor being connected to a node for connection to the load;

a second emitter-follower stage through which a control current flows between the supply voltage and a reference potential, said second emitter-follower stage comprising a third and a fourth transistor, each having an emitter, a base, and a collector, the emitter of the third transistor being connected to the supply voltage, the base of the third transistor being connected to the collector of the second transistor, the emitter of said fourth transistor being connected to the base of said second transistor and to the collector of the third transistor, the base of said fourth transistor being connected to receive said input voltage signal, and the collector of said fourth transistor being connected to the reference voltage;

wherein a base-emitter voltage of the first transistor is applied across the base-emitter junction of the third transistor to provide said reference current through said second stage to maintain a voltage across the load that has a fixed relationship to the input voltage signal;

and first and second resistors of substantially equal value, said first and second resistors being connected, respectively, between the emitter of said first transistor and the collector of the second transistor, and from the emitter of said second transistor to the load connection node to maintain the $V_{BE}$ of said second transistor substantially equal to the $V_{BE}$ of said fourth transistor.

* * * * *